United States Patent
Kuroda et al.

(10) Patent No.: US 7,057,968 B2
(45) Date of Patent: Jun. 6, 2006

(54) SEMICONDUCTOR INTEGRATED CIRCUIT DEVICE

(75) Inventors: Naoki Kuroda, Kyoto (JP); Yuji Nakai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/075,739

(22) Filed: Mar. 10, 2005

(65) Prior Publication Data

US 2005/0207266 A1    Sep. 22, 2005

(30) Foreign Application Priority Data

Mar. 16, 2004    (JP)    .............. 2004-074415

(51) Int. Cl.
*G11C 8/00*    (2006.01)
(52) U.S. Cl. ............ 365/233; 365/230.01; 365/230.03; 365/230.08
(58) Field of Classification Search ................ 365/233, 365/230.01, 230.08, 230.03
See application file for complete search history.

(56) References Cited

U.S. PATENT DOCUMENTS 5,703,822 A * 12/1997 Ikeda .................... 365/221
6,584,036 B1    6/2003 Kurjanowicz et al.

OTHER PUBLICATIONS

Hideo Ohwada et al., "A Single-Chip Band-Segmented-Transmission OFDM Demodulator for Digital Terrestrial Television Broadcasting", 2001 IEEE International Solid-State Circuits Conference.
Toshiba Semiconductor Company, "Embedded DRAM technology" <http://www.semicon.toshiba.co.jp/prd/asIc/index.html>.

* cited by examiner

*Primary Examiner*—Tuan T. Nguyen
*Assistant Examiner*—Pho M. Luu
(74) *Attorney, Agent, or Firm*—McDermott Will & Emery LLP

(57) ABSTRACT

Logic circuits access a memory block by way of an access circuit. The memory block, which is formed of a mixed configuration of DRAMs and an SRAM, realizes the desired memory space. A data output register is provided at the output side of the SRAM so as to synchronize data output timing from the DRAMs with data output timing from the SRAM.

4 Claims, 7 Drawing Sheets

SEMICONDUCTOR INTEGRATED CIRCUIT DEVICE

CROSS-REFERENCE TO RELATED APPLICATION

The disclosure of Japanese Patent Application No. 2004-74415 filed on Mar. 16, 2004 including specification, drawings and claims is incorporated herein by reference in its entirety.

BACKGROUND OF THE INVENTION

The present invention relates to a semiconductor integrated circuit device in which a logic circuit and a memory block accessed by the logic circuit are incorporated.

Conventionally, memories corresponding to individual logic circuit blocks have been embedded on a system LSI to achieve performance improvement and power consumption reduction. FIG. 7 is a block diagram illustrating an example of a conventional semiconductor integrated circuit device. As shown in FIG. 7, a static random access memory (which will be hereinafter referred to as an "SRAM") 51 having a size ranging from about several kilobits to about several hundred kilobits is used as a storage section for data which is required to be processed at high speed. This is because an SRAM has high random access performance and efficient compilability as well, such that capacity and bit width necessary for data processing can be combined easily. On the other hand, as a storage section for large volume data which does not need high-speed processing and has certain limited patterns, a general dynamic random access memory (which will be hereinafter referred to as a "DRAM") 52 having a size on the order of megabits or more is provided (see non-patent literature 1, for example.)

Meanwhile, DRAMs which are different from general DRAMs have been also embedded on an increasing number of system LSIs in order to achieve not only performance increase and power consumption reduction, but also total cost reduction or the like obtainable by optimizing necessary memory capacity to a certain degree (see non-patent literature 2, for example.)

(Non-patent literature 1) Hideo Ohwada and six other persons 'A single-Chip Band-Segmented-Transmission OFDM Demodulator for Digital Terrestrial Television Broadcasting' 2001 IEEE International Solid-State Circuits Conference (Non-patent literature 2) Toshiba Semiconductor Company, 'Embedded DRAM technology' (the search of which was performed on Sep. 25, 2003) Internet <http://www.semicon.toshiba.co.jp/prd/asic/index.html>

SUMMARY OF THE INVENTION

However, the conventional device has the following problems.

In the configuration shown in FIG. 7, for each logic circuit block, one or more SRAMs suitable for a necessary memory space and a necessary number of bits are incorporated by utilizing the efficient compilability of the SRAMs. This permits local optimization of the memory allocation. However, since the capacity of each SRAM is small, even if the ratio of the total memories to the chip becomes too high, the designer of the system LSI is not likely to notice that. Consequently, memory optimization in the entire system LSI is not necessarily performed properly in many cases.

Furthermore, as the scale of system LSI has increased along with performance improvement thereof, the design of respective circuit blocks has been specialized and subdivided year after year. As a result, the ratio of embedded memories has been increasing, but memory optimization in the entire system LSI has become more difficult.

Moreover, an SRAM, whose memory cells each consist of six transistors, is not suited for having a large capacity in terms of integration. Also, if the memory area of an SRAM is increased for a larger capacity, high speed performance, which is an advantage of the SRAM, deteriorates. These problems have also presented difficulties in achieving the optimization of entire memories.

On the other hand, a DRAM, whose memory cells each consist of, e.g., a single transistor and a single capacitor, is superior to an SRAM in terms of high integration. Thus, incorporation of DRAMs has also been examined and realized to attain the optimization of entire memories.

However, particularly in general DRAMs, the number of I/O bits is often limited, and therefore when designers try to realize a memory block with the desired specifications, the resultant memory area will be often excessive or deficient. More specifically, if a memory block is formed of DRAMs alone, an excessive space will be produced. Therefore, in order to form the desired memory space without wasting any area, a method may be adopted in which DRAMs are used first, and the insufficiency is complemented by SRAMs which have efficient compilability.

However, DRAMs differ from SRAMs in interfaces such as data output timing, address specification format, and command input method. If a memory block is formed of DRAMs and SRAMs, the access control thereof may thus become complicated.

In view of the above problem, an object of the present invention is to provide a semiconductor integrated circuit device in which a memory block having the desired memory space is formed and memory access is realized easily.

An inventive semiconductor integrated circuit device includes: a DRAM for storing at least one bit of data written into an address of a memory block; an SRAM for storing at least another one bit of the data; and a register coupled to an output of the SRAM, the register outputting data in synchronism with the DRAM.

In the inventive device, since the memory block is composed of the DRAM and the SRAM, the desired memory space is formed without wasting any area by utilizing the high level of integration of the DRAM and the compilability of the SRAM. In addition, the data output register for synchronizing data output timing produced from the SRAM with data output timing produced from the DRAM is disposed at the output side of the SRAM, which enables access to the memory block to be realized easily.

In the inventive device, the DRAM preferably has a common address specification format with the SRAM.

Also, it is preferable that the DRAM has a common command input method with the SRAM.

The inventive device preferably further includes: a plurality of logic circuits, and an access circuit for, upon receipt of an instruction from the logic circuits, accessing the memory block by performing time division processing, and an operation clock for the memory block is preferably set at a higher frequency than an operation clock for the logic circuits.

In the present invention, the embedding of the DRAM and SRAM enables the desired memory space to be formed without wasting any area, and in addition permits access to the memory block to be realized easily.

DESCRIPTION OF THE PREFERRED EMBODIMENTS

Hereinafter, preferred embodiments of the present invention will be described with reference to the accompanying drawings.

Figure 1:
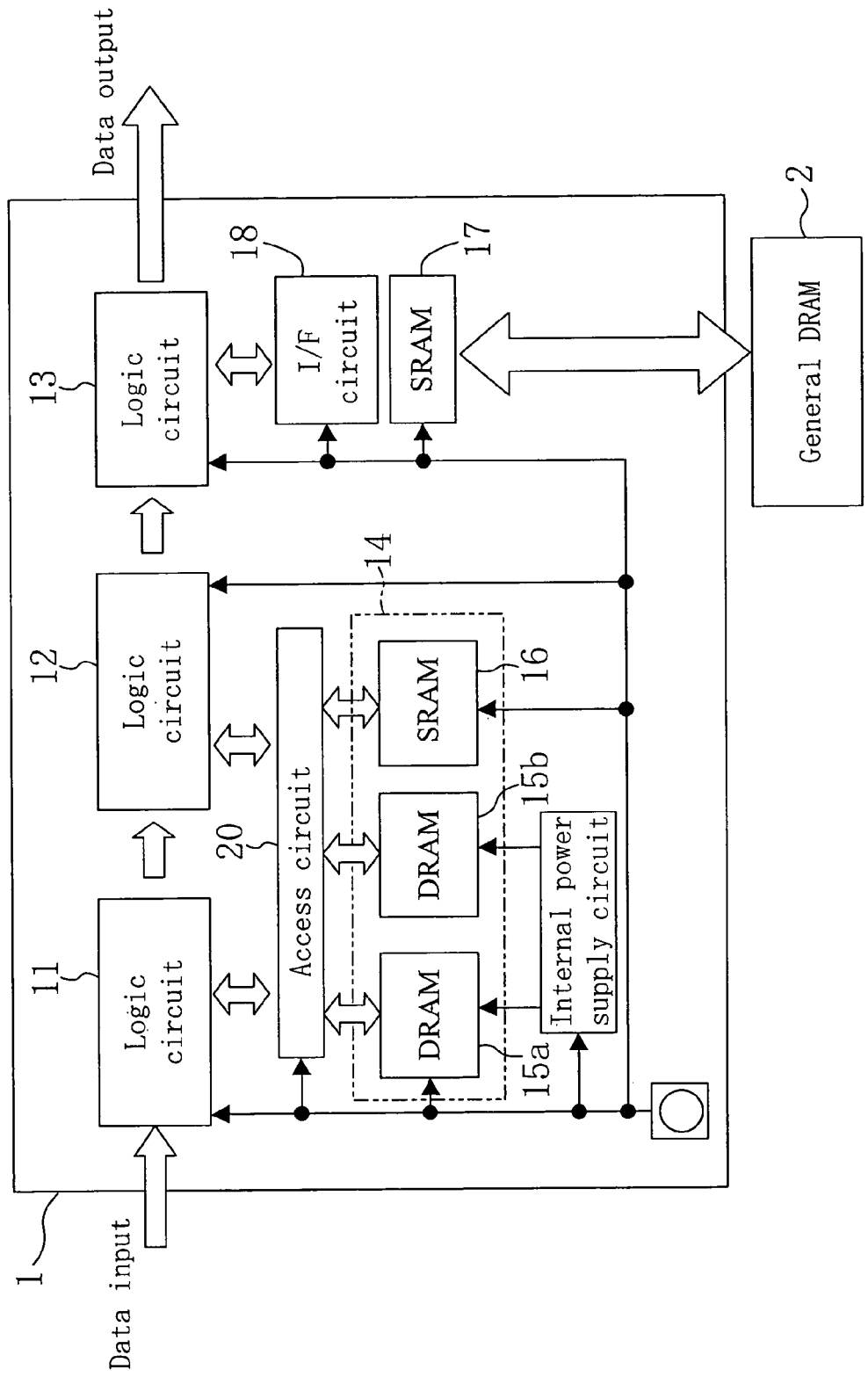
FIG. 1 illustrates the main components of a semiconductor integrated circuit device in accordance with an embodiment of the present invention.

FIG. 1 is a block diagram illustrating the main components of a semiconductor integrated circuit device in accordance with an embodiment of the present invention. In FIG. 1, the semiconductor integrated circuit device 1 includes a plurality of logic circuits 11, 12, and 13 for realizing respective predetermined processing functions, a memory block 14 including two DRAMs 15a and 15b and an SRAM 16, and an SRAM block 17. The memory block 14 is accessible from the logic circuits 11 and 12 via an access circuit 20, while the SRAM block 17 is accessible from the logic circuit 13 via an I/F circuit 18. The access circuit 20 is formed so as to be capable of performing time division data processing so that the logic circuits 11 and 12 can share the memory block 14. The sharing of the memory block 14 by the logic circuits 11 and 12 reduces area overhead caused by the peripheral circuits of the memories, thereby allowing a further decrease in the area of the device. The SRAM block 17 is configured capable of transferring data to/from a general DRAM 2.

Figure 2:
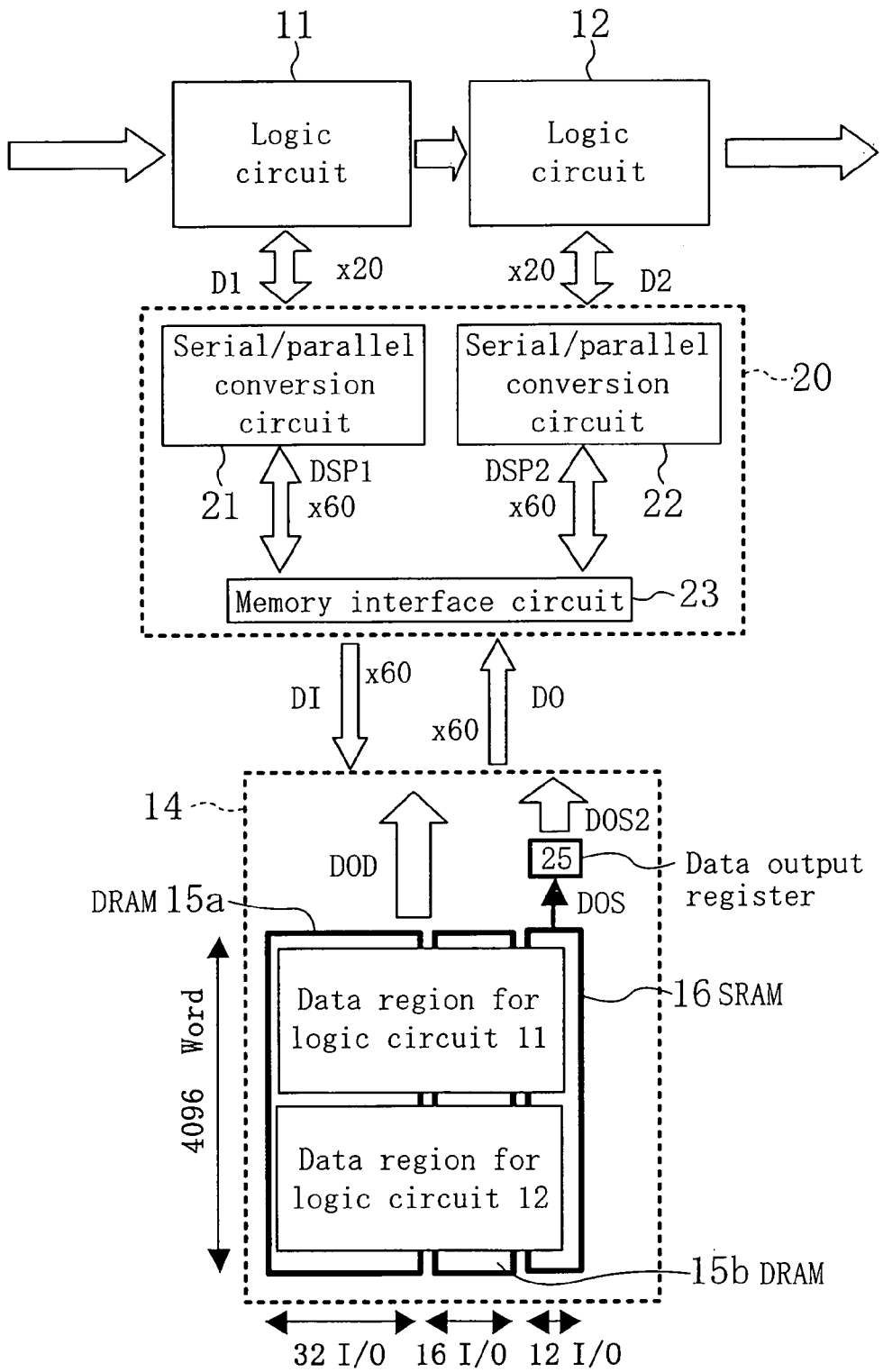
FIG. 2 illustrates the detailed configuration of an access circuit and a memory block shown in FIG. 1.

FIG. 2 illustrates an exemplary detailed configuration of the access circuit 20 and memory block 14. In FIG. 2, the memory block 14, using the DRAM 15a having a 128-kilobit memory capacity and a 32-bit data I/O, the DRAM 15b having a 64-kilobit memory capacity and a 16-bit data I/O, and the SRAM 16 having a 48-kilobit memory capacity and a 12-bit data I/O, forms a memory space organized as 4,096 words of data I/O 60 bits each. The high order 32 bits of the 60-bit data at each address are stored in the DRAM 15a, the subsequent 16 bits thereof are stored in the DRAM 15b, and the low order 12 bits thereof are stored in the SRAM 16.

The memory block 14 further includes a data output register 25, which is disposed at the output side of the SRAM 16 and synchronizes data output timing produced from the SRAM 16 with data output timing produced from the DRAMs 15a and 15b. In this embodiment, the data output register 25 retains data output DOS from the SRAM 16 for one clock cycle, and then outputs the retained data, as output DOS2 from the memory block 14.

The logic circuits 11 and 12 output 20-bit data D1 and D2, respectively. In the access circuit 20, serial/parallel conversion circuits 21 and 22 perform serial/parallel conversion of the 20-bit output data D1 and D2 produced from the logic circuits 11 and 12 into 60-bit data DSP1 and DSP2, respectively. And a memory interface circuit 23 supplies the data DSP1 and DSP2 to the memory block 14 as input data DI.

The memory interface circuit 23 also provides, as data DSP1 and DSP2, output data DO produced from the memory block 14 to the serial/parallel conversion circuits 21 and 22. The serial/parallel conversion circuits 21 and 22 perform parallel/serial conversion of the 60-bit data DSP1 and DSP2 into 20-bit data D1 and D2, respectively. The data D1 and D2 are supplied to the logic circuits 11 and 12.

In this embodiment, the DRAMs 15a and 15b are formed to have a common address specification format with the SRAM 16. For example, address multiplexing used in general DRAMs is changed to address non-multiplexing which is the address specification format that SRAMs use. The DRAMs 15a and 15b are also formed having a common command input method with the SRAM 16.

Figure 3A:
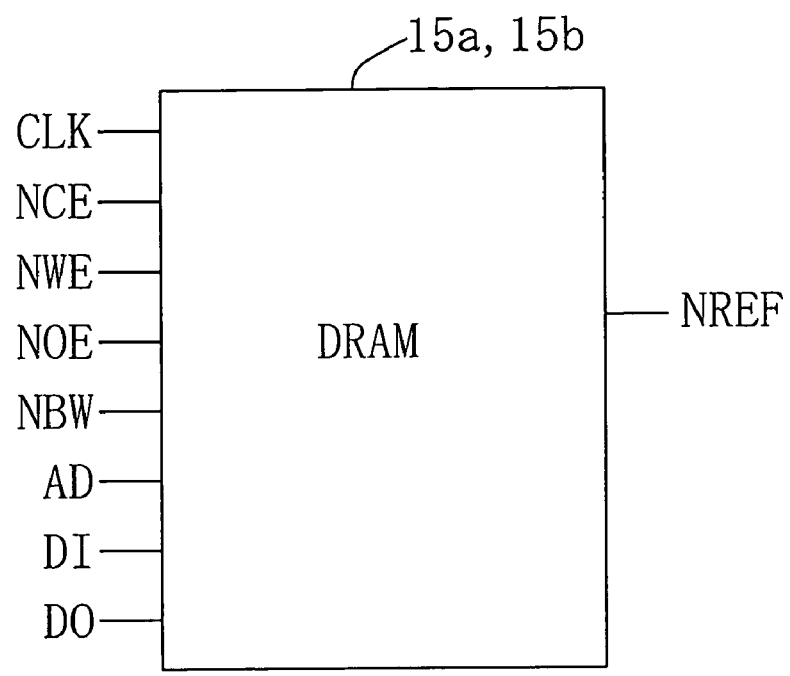
FIG. 3 is a conceptual view illustrating the input/output pins of DRAMs and an SRAM in accordance with this embodiment.
Figure 3B:
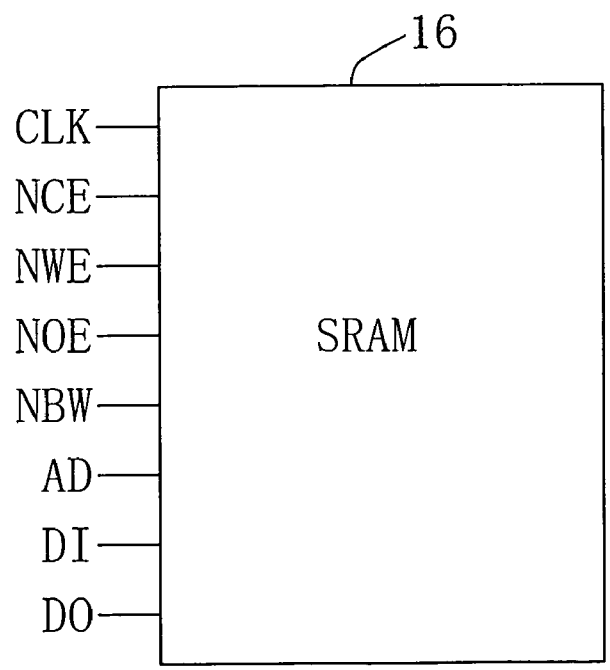

More specifically, as shown in FIG. 3, the input/output pins of the DRAMs 15a and 15b are the same as those of the SRAM 16, except for NREF (refresh enable) input. In FIG. 3, CLK refers to "clock", NCE to "read/write enable", NWE to "write enable", NOE to "output enable", NBW to "1-bit write enable", and AD to "address". It should be noted that the NREF input, used to control cell-data refresh operation, which is peculiar to DRAMs, can be omitted, if a means for automatically performing such refresh operation is provided in the DRAM. Therefore, it is possible for the DRAMs to have exactly the same input/output pins as those of the SRAM.

Figure 4:
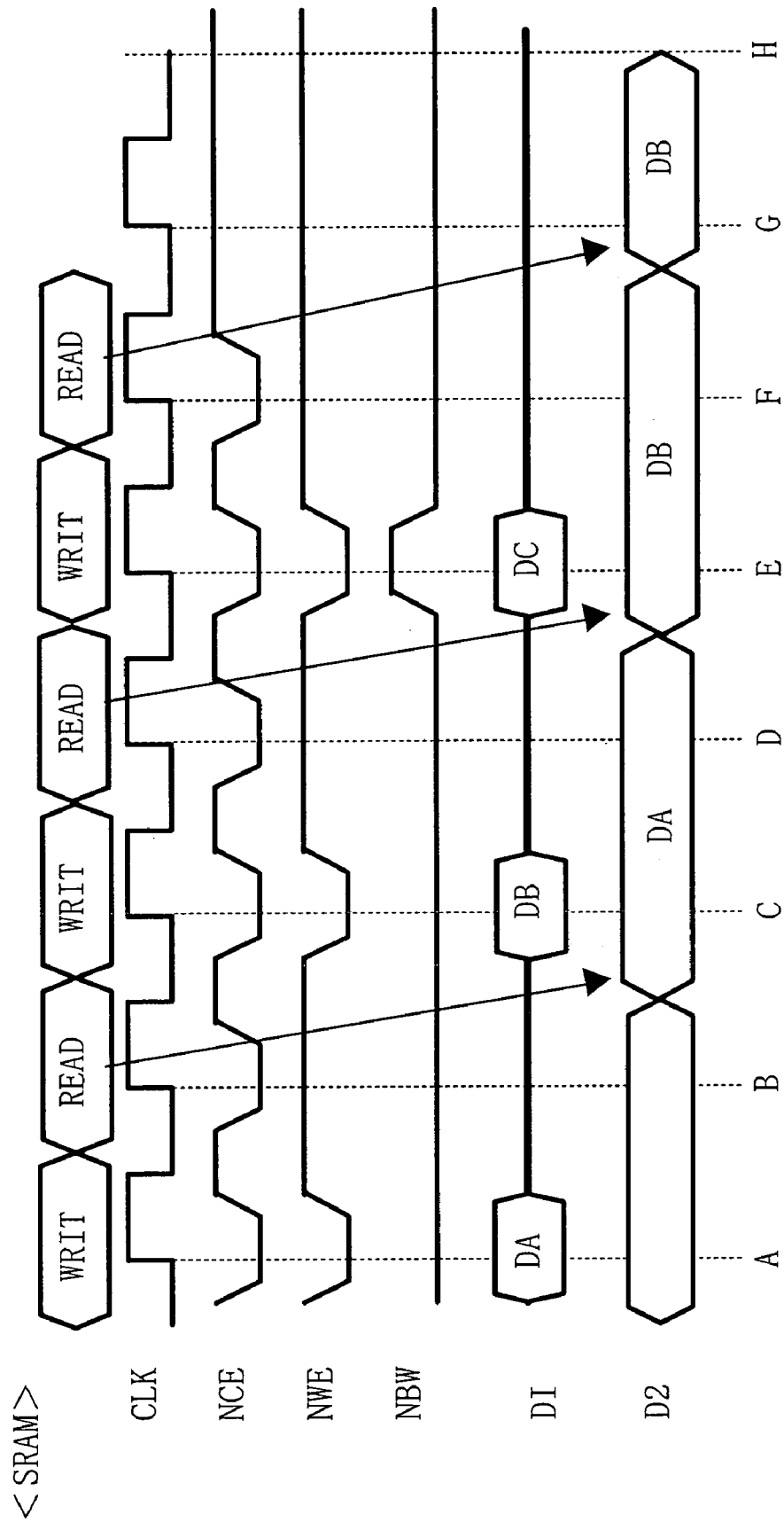
FIG. 4 is an SRAM timing chart.
Figure 5:
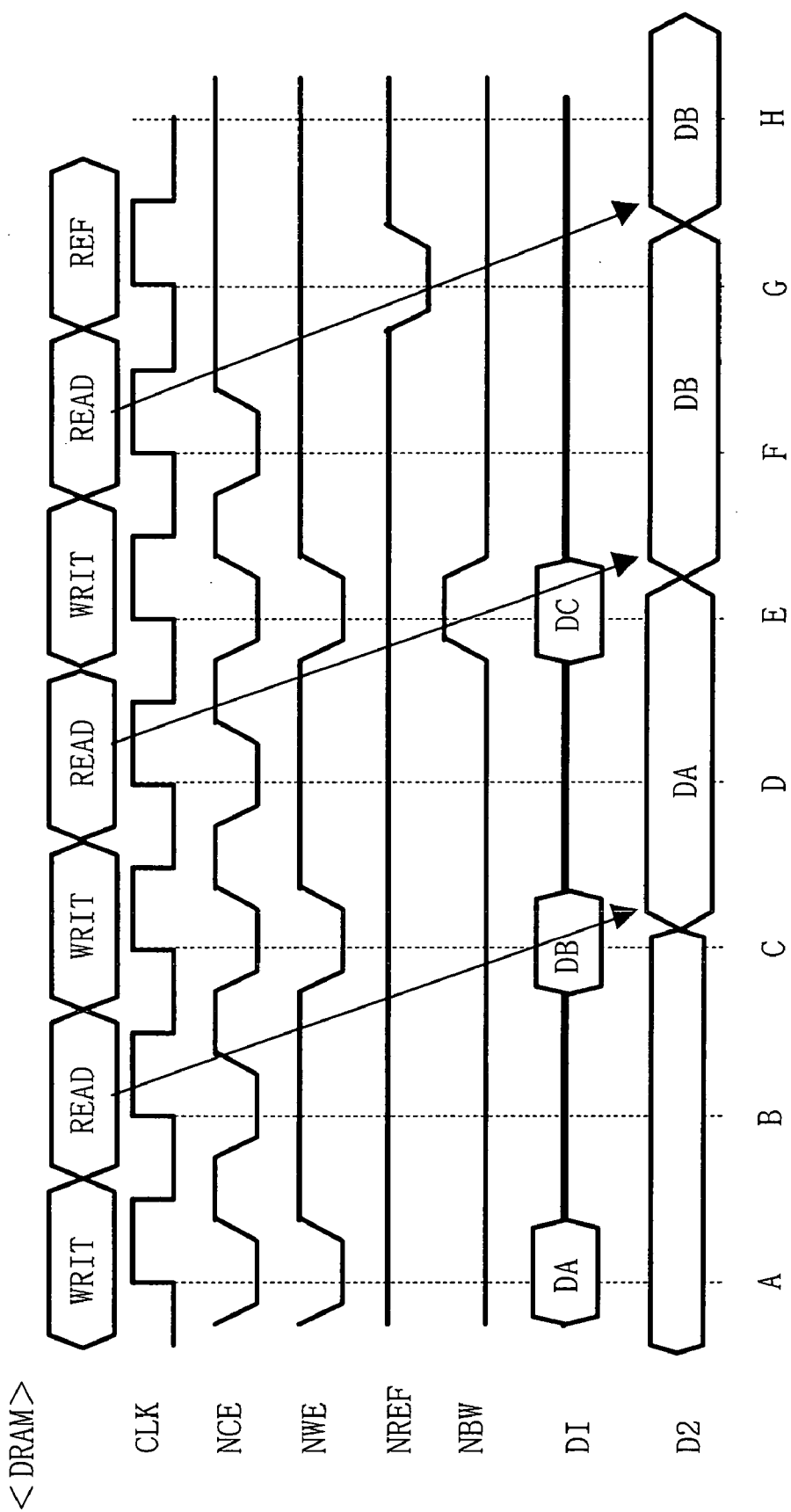
FIG. 5 is a DRAM timing chart.

Also, as can be seen from a timing chart for SRAM's operation in FIG. 4 and a timing chart for DRAM's operation in FIG. 5, commands, addresses, and data input timings used for the DRAMs 15a and 15b and the SRAM 16 are the same. In other words, the DRAMs 15a and 15b and the SRAM 16 have common interfaces. This commonality of interfaces is achievable by the above-mentioned address specification format change, and in addition, by changing the command input method and by providing a means for automatically performing precharge operation in the DRAMs, for example.

In this embodiment, as shown in the timing chart of FIG. 5, data output from the DRAMs is delayed by one cycle behind the clock at which a READ command has been input, which situation is called "latency=1". The data output register 25 is provided for adjustment of the output timing delayed by this latency.

Figure 6:
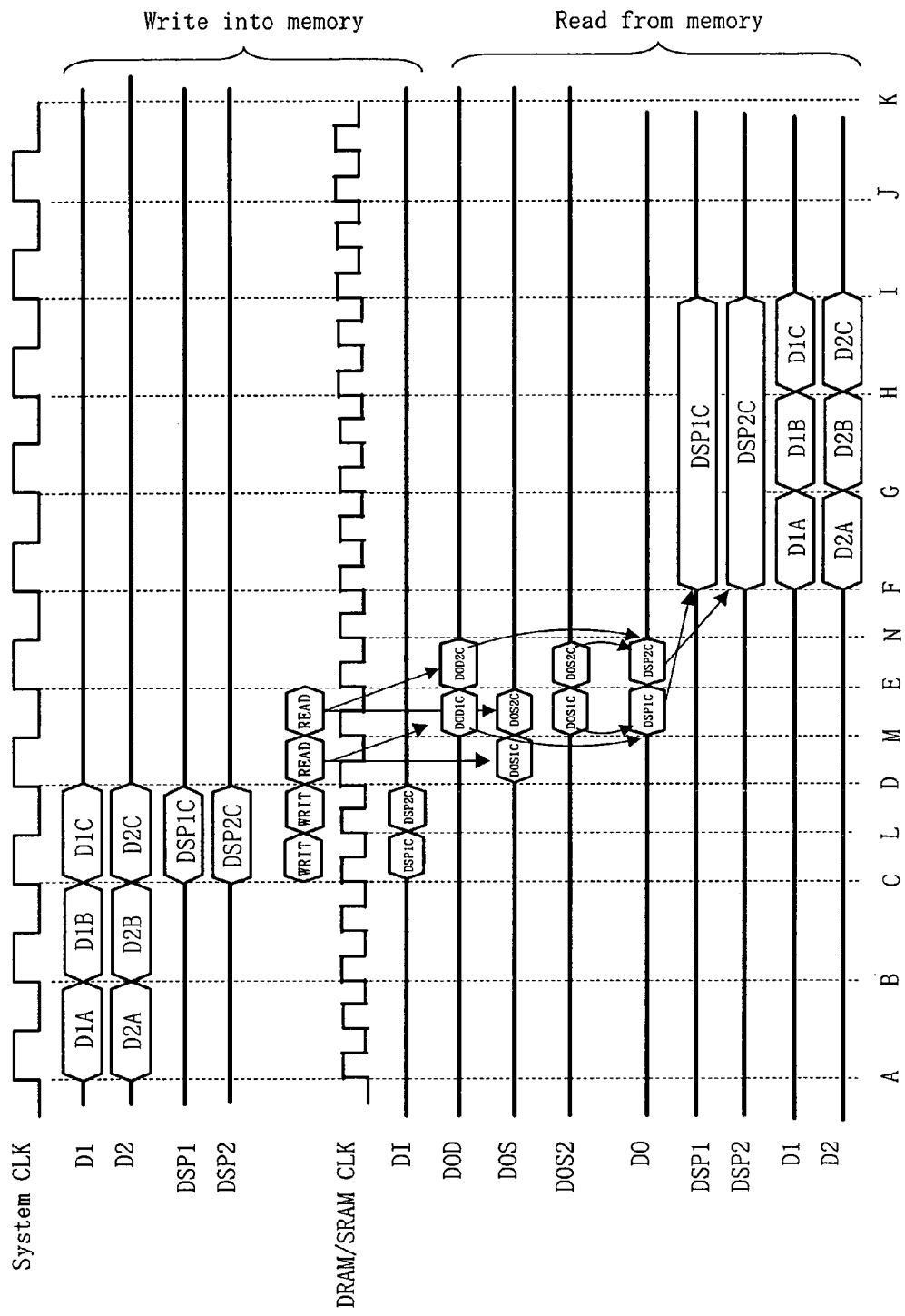
FIG. 6 is a timing chart indicating operation performed by the configuration shown in FIG. 2.
Figure 7:
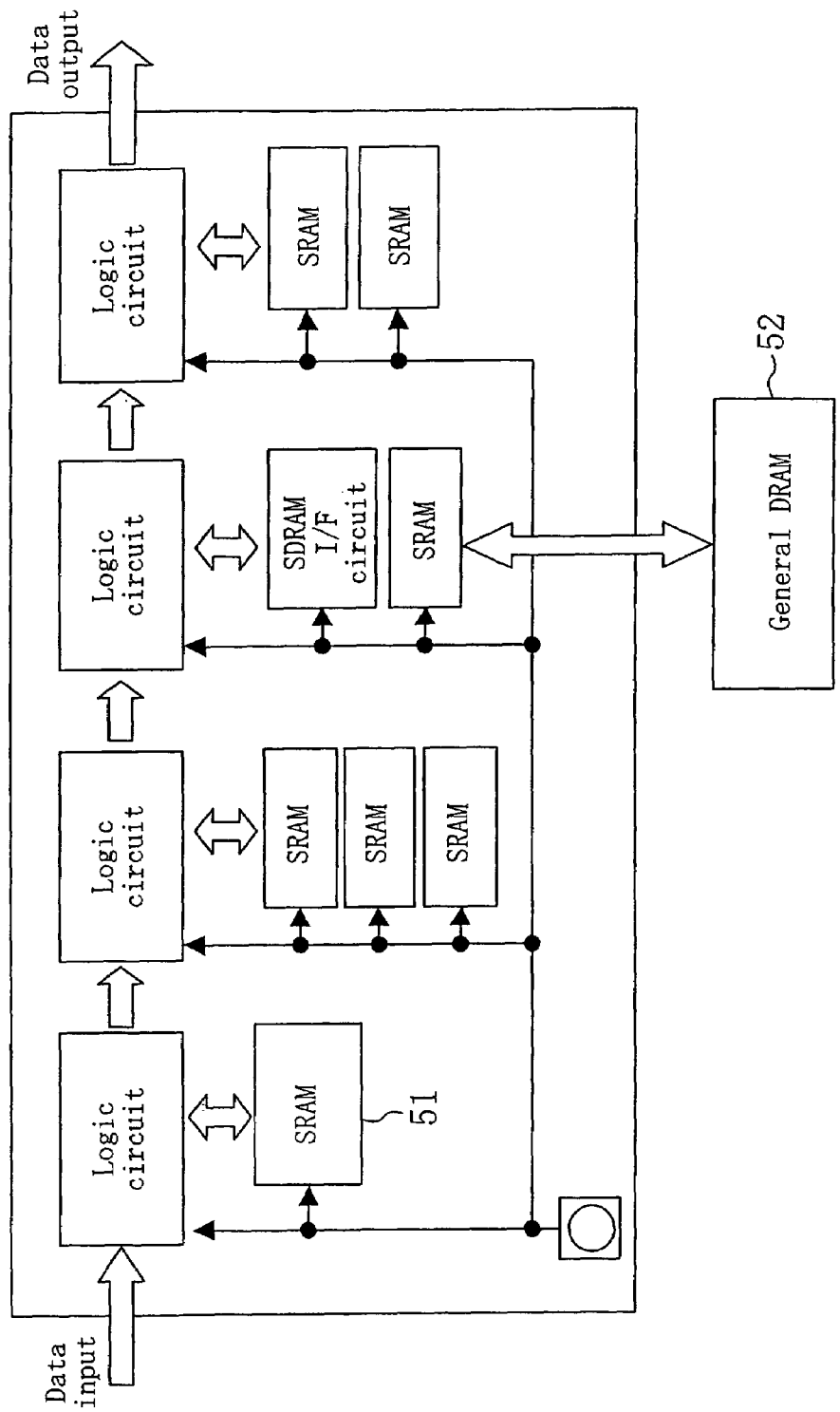
FIG. 7 illustrates the configuration of a conventional semiconductor integrated circuit device.

Operation performed by the configuration shown in FIG. 2 will be described with reference to a timing chart shown in FIG. 6. It is assumed herein that the operation clock for the DRAMs 15a and 15b and SRAM 16 is set at a frequency twice as high as that of the system clock. In other words, the operation clock for the memory block 14 is set at a higher frequency than the operation clock for the logic circuits 11 and 12. This provides high data-transfer efficiency, thereby achieving high data-processing capability.

(Data Store)

First, at time A, 20-bit data D1A and D2A are transferred from the logic circuits 11 and 12, respectively, to the serial/parallel conversion circuits 21 and 22 in synchronization with the system clock. Likewise, at time B, 20-bit data D1B and D2B, and at time C, 20-bit data D1C and D2C are transferred from the logic circuits 11 and 12 to the serial/parallel conversion circuits 21 and 22, respectively.

At time C, the serial/parallel conversion circuit 21 performs serial/parallel conversion of the 20-bit data D1A, D1B and D1C transferred by then, into 60-bit data DSP1C. Similarly, at time C, the serial/parallel conversion circuit 22 performs serial/parallel conversion of the 20-bit data D2A, D2B and D2C transferred by then, into 60-bit data DSP2C.

The access circuit 20 writes the 60-bit data DSP1C and DSP2C into the memory block 14, which is formed of the two DRAMs 15a and 15b and the one SRAM 16 and has the 60-bit data I/O, in accordance with a clock having a frequency twice as high as that of the system clock. As mentioned above, since the interface commonality is achieved between the DRAMs 15a and 15b and the SRAM 16, it is possible to write the data simultaneously. More specifically, at time C, the data DSP1C is first written into the memory block 14 by a WRITE command, and at the next clock cycle, i.e., at time L, the remaining data DSP2C is written into the memory block 14 by a WRITE command.

(Data Retrieve)

At time D, the access circuit 20 instructs the memory block 14 to read the data DSP1C by a READ command. At the next clock cycle, that is, at time M, the access circuit 20 instructs the memory block 14 to read the data DSP2C by a READ command.

At time D, data DOS1C stored in the SRAM 16 is output in synchronization with a DRAM/SRAM clock and stored in the data output register 25. The DRAMs 15a and 15b, which operate based on "latency=1", output data DOD1C at the next clock cycle, that is, at time M. At time M, the data output register 25 outputs the data DOS1C. Consequently, the data DOD1C read from the DRAMs 15a and 15b and the data DOS1C read from the SRAM 16 by way of the data output register 25 as a result of the READ command issued at time D are output from the memory block 14 and transferred as the 60-bit data DSP1C to the memory interface circuit 23.

At time M, data DOS2C stored in the SRAM 16 is output in synchronization with the DRAM/SRAM clock and stored in the data output register 25. The DRAMs 15a and 15b output data DOD2C at the next clock cycle, that is, at time E. At time E, the data output register 25 outputs the data DOS2C. Consequently, the data DOD2C read from the DRAMs 15a and 15b and the data DOS2C read from the SRAM 16 by way of the data output register 25 as a result of the READ command issued at time M are output from the memory block 14 and transferred as the 60-bit data DSP2C to the memory interface circuit 23.

Subsequently, at time F, the memory interface circuit 23 transfers the 60-bit data DSP1C and DSP2C to the serial/parallel conversion circuits 21 and 22, respectively. The serial/parallel conversion circuit 21 performs parallel/serial conversion of the 60-bit data DSP1C and sequentially transfers to the logic circuit 11 the resultant data, as 20-bit data D1A, D1B and D1C, at times F, G, and H, respectively, in synchronization with the system clock. Likewise, the serial/parallel conversion circuit 22 performs parallel/serial conversion of the 60-bit data DSP2C and sequentially transfers to the logic circuit 12 the resultant data, as 20-bit data D2A, D2B and D2C, at times F, G, and H, respectively, in synchronization with the system clock.

As described above, according to this embodiment, even if a memory block accessed from logic circuits is formed of a mixed structure of DRAM and SRAM, memory access is easily realized by disposing a data output register for synchronizing data output timing from the SRAM with data output timing from the DRAM. In addition, the commonality of address specification format and command input method is achieved between the DRAM and the SRAM to allow them to have the same interfaces, whereby memory access as well as time division multiplex data processing, which enables access from the logic circuits, are realized easily.

Moreover, in forming the desired memory space having the 60-bit I/O described in this embodiment, for example, if the use of a DRAM produces any excess or deficiency, the memory space is filled by an SRAM(s) which is easily compiled, so that no excessive space is created, whereby the chip area is reduced more reliably. In other words, the cost reduction effect obtainable by the optimum use of the DRAM is exploited, while characteristics, such as high performance and efficient compilability, of the SRAM are also utilized, whereby an optimum memory space is realized.

The commonality of the memory interfaces permits wide variations in memory accesses which are made for data transfer, while producing an area reduction effect. Furthermore, in a case where design changes occur during the design phase, the commonality of the interfaces between the DRAM and the SRAM allows replacement of the SRAM with the DRAM, and vice versa, to be performed easily, thereby providing the effect of reducing the turnaround time of the design.

In a case in which the data output latency of the DRAMs is 2 or more, data output registers may be provided in a corresponding number of stages. Also, when the data output latency of the DRAMs is 0, the data output register described in this embodiment may be omitted, in which case it is possible to advance data transfer by one cycle of the system CLK.

The data output register can be also omitted in this embodiment, if, for example, only the output of READ commands to the SRAM 16 is delayed by one cycle of the DRAM/SRAM clock. However, in that case, command output control is required to be performed with consideration given to the internal configuration of the memory block 14, that is, the configuration in which both the DRAM and the SRAM are present.

Moreover, if refresh operation is added to be performed in the DRAMs during an idle time in time E, for example, it is possible to apparently hide the refresh operation in the data transfer time.

The capacity of the memory block, the number of I/Os in the memory block, the specifications of DRAMs and SRAMs that form the memory block, and the number of those DRAMs and SRAMs are not limited to those described in this embodiment. In addition, the present invention is also applicable to a configuration in which a single logic circuit accesses a memory block.

The present invention, which not only enables the formation of the desired memory space with no area wasted, but also easily realizes memory access, is thus effective in achieving performance improvement, and cost reduction obtainable by decrease in the chip area of a system LSI, for example.

What is claimed is:

1. A semiconductor integrated circuit device comprising:
   a DRAM for storing at least one bit of data written into an address of a memory block;
   an SRAM for storing at least another one bit of the data; and
   a register coupled to an output of the SRAM, the register outputting data in synchronism with the DRAM,
   wherein said at least one bit of the data is directly provided from the DRAM while at the same time said at least another one bit of the data is provided by the SRAM via the register as an output of the memory block.

2. The device of claim 1, wherein the DRAM has a common address specification format with the SRAM.

3. The device of claim 2, wherein the DRAM has a common command input method with the SRAM.

4. A semiconductor integrated circuit device comprising:
a DRAM for storing at least one bit of data written into an address of a memory block;
an SRAM for storing at least another one bit of the data;
a register coupled to an output of the SRAM, the register outputting data in synchronism with the DRAM;
a plurality of logic circuits, and
an access circuit for, upon receipt of an instruction from the logic circuits, accessing the memory block by performing time division processing,
wherein an operation clock for the memory block is set at a higher frequency than an operation clock for the logic circuits.

* * * * *

UNITED STATES PATENT AND TRADEMARK OFFICE
CERTIFICATE OF CORRECTION

| | |
|---|---|
| PATENT NO. | : 7,057,968 B2 |
| APPLICATION NO. | : 11/075739 |
| DATED | : June 6, 2006 |
| INVENTOR(S) | : Naoki Kuroda et al. |

It is certified that error appears in the above-identified patent and that said Letters Patent is hereby corrected as shown below:

On the Title page of the Letters Patent,

Under section "(56) References Cited, U.S. PATENT DOUMENTS", change "6,584,036 B1 " to -- 6,584,036 B2 --, Under section "(56) References Cited, OTHER PUBLICATIONS", change " <http://www.semicon.toshiba.co.jp/prd/aslc/index.html " to
-- <http://www.semicon.toshiba.co.jp/prd/asic/index.html --

Signed and Sealed this

Nineteenth Day of December, 2006

JON W. DUDAS
*Director of the United States Patent and Trademark Office*